United States Patent [19]

Olson

[11] Patent Number: 4,612,632
[45] Date of Patent: Sep. 16, 1986

[54] POWER TRANSITION WRITE PROTECTION FOR PROM

[75] Inventor: Anthony M. Olson, Stevensville, Mich.

[73] Assignee: Zenith Electronics Corporation, Glenview, Ill.

[21] Appl. No.: 679,784

[22] Filed: Dec. 10, 1984

[51] Int. Cl.$^4$ .................. G11C 29/00; G11C 7/00
[52] U.S. Cl. .................................. 365/226; 365/228; 371/66
[58] Field of Search .................. 365/226, 228, 201; 371/66; 307/299 A

[56] References Cited

U.S. PATENT DOCUMENTS

| | | | |
|---|---|---|---|
| 4,375,663 | 3/1983 | Arcara et al. | 365/226 |
| 4,399,524 | 8/1983 | Muguruma et al. | 365/228 |
| 4,433,390 | 2/1984 | Carp et al. | 365/226 |
| 4,534,018 | 8/1985 | Eckert et al. | 365/228 |

FOREIGN PATENT DOCUMENTS 0097198  6/1983  Japan ........................... 365/228

Primary Examiner—James W. Moffitt
Assistant Examiner—Glenn A. Gossage

[57] ABSTRACT

A power transition detection and override circuit is coupled to the OUTPUT-ENABLE ($\overline{OE}$) pin of a non-volatile electrically erasable programmable read only memory (EEPROM) for preventing inadvertent write commands thereto from a microprocessor arising from supply voltage ($V_{cc}$) transitions, including power up and power down. With the EEPROM provided with internal write protection for $V_{cc}$ less than approximately 3.0 VDC, the power transition detection and override circuit holds the $\overline{OE}$ pin of the EEPROM low until $V_{cc}$ reaches a specified operating voltage, e.g., 4.75 VDC. This masks any WRITE ENABLE ($\overline{WE}$) line glitches by the read operation of the active low $\overline{OE}$ line.

7 Claims, 1 Drawing Figure

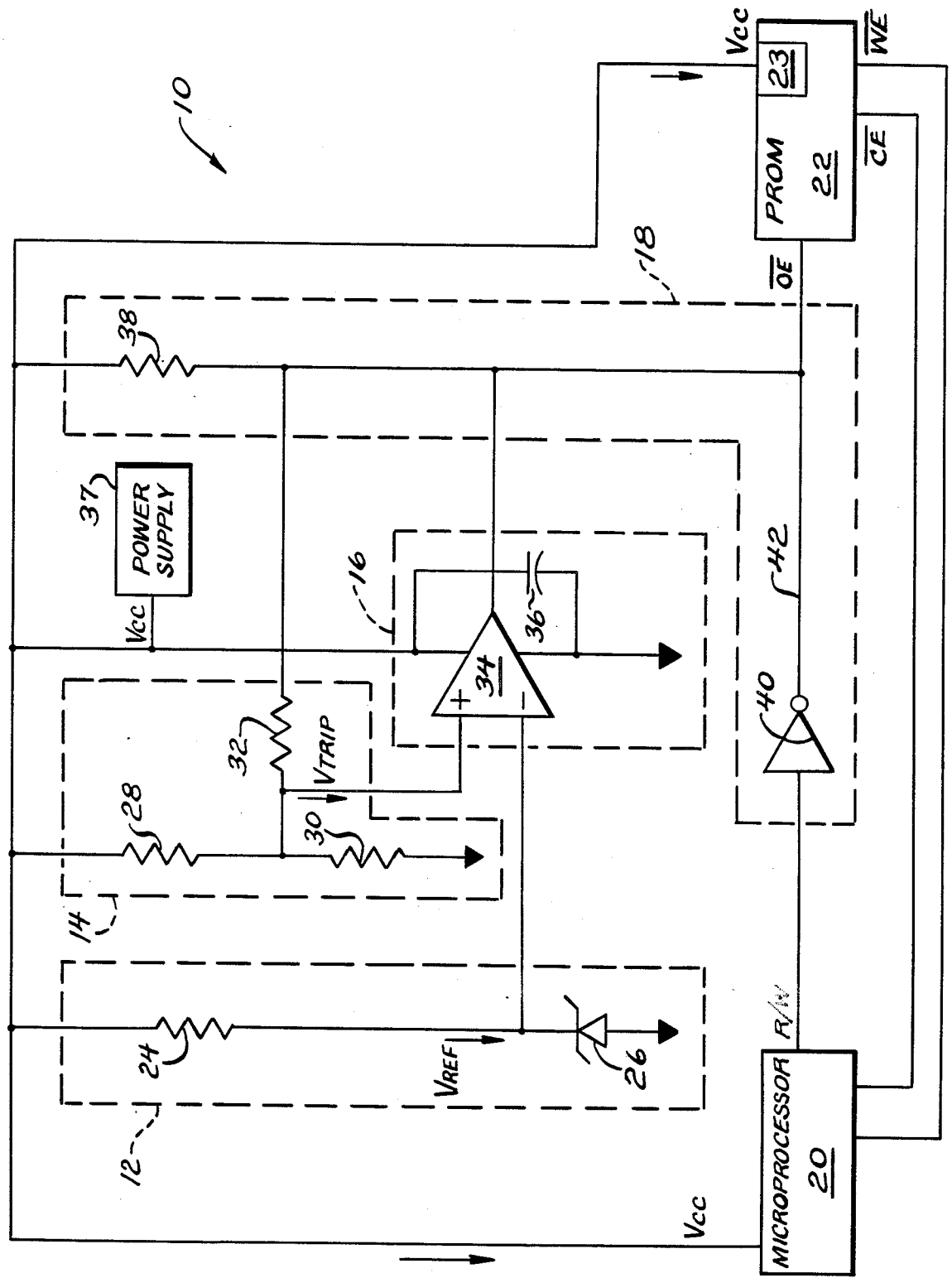

POWER TRANSITION WRITE PROTECTION FOR PROM

BACKGROUND OF THE INVENTION

This invention relates generally to nonvolatile programmable memory circuits and is particularly directed to the prevention of inadvertent write operations in a nonvolatile programmable read only memory by a microprocessor arising from supply voltage variations.

When power is applied to a system incorporating a microprocessor, the microprocessor is typically energized after a suitable safe time delay allowing for system stabilization for providing various, well-defined power supply levels thereto. After the microprocessor is initially energized, it is reset to an initial set of conditions and begins executing instructions at a start address within its read only memory (ROM). The operating program stored within the microprocessor's ROM then controls its operation in sequentially executing the various instructions stored therein.

In a microprocessor controlled system, there is frequently a nonvolatile programmable memory device in which is stored operating instructions and data for executing a specific task stored within the microprocessor's ROM. Where the memory device is a programmable read only memory (PROM) the information stored within the memory device may be updated by the microprocessor in accordance with varying system conditions and requirements. Thus, data may be either written into or read from selected memory locations within the PROM by the microprocessor.

The microprocessor and the PROM are designed to operate at a specified voltage level which typically is on the order of 5 VDC. However, these devices will operate at lower voltages, although in a frequently degraded, unreliable state. For example, a nonvolatile PROM which is designed to operate at 4.75 VDC may operate in a degraded mode with a supply voltage as low as 3.0 VDC. The microprocessor similarly possesses a supply voltage range over which it will operate, but in a diminished capacity. A microprocessor is typically provided with a RESET input to ensure that it is properly initialized only after its supply voltage has reached, or is at, a predetermined level. Similarly, a nonvolatile programmable memory device typically includes internal circuitry which precludes its operation below a predetermined threshold voltage level. This threshold voltage is typically set at a voltage substantially less, e.g., 3.0 VDC, than the nominal operating voltage of the memory device due to the wide tolerances inherent in the fabrication of these integrated circuits. This prevents the memory device from transitioning to an inactive state in response to small variations in the power supply voltage. Therefore, the nonvolatile programmable memory device is generally capable of operating within the supply voltage range of 3.0 to 4.5 VDC wherein it is subject to erroneous write commands from the microprocessor. These erroneous write commands cause the loss of previously stored data as well as the storage of erroneous data in the nonvolatile programmable memory device due to the nonvolatility of the write operation therein.

The present invention is intended to avoid the aforementioned problem encountered in the prior art by providing write protection for a nonvolatile PROM in the event of inadvertent microprocessor generated write commands arising from supply voltage transisents including system power up and power down.

OBJECTS OF THE INVENTION

Accordingly, it is an object of the present invention to provide more reliable operation in a microprocessor controlled system including a nonvolatile programmable memory device.

It is another object of the present invention to prevent improper operation in a microprocessor controlled system having a programmable memory device upon variations in the supply voltage including system power up and power down.

Yet another object of the present invention is to protect an electrically erasable programmable read only memory from erroneous write commands from a microprocessor arising from variations in the supply voltage provided thereto.

A further object of the present invention is to prevent inadvertent write operations in a nonvolatile programmable memory device.

BRIEF DESCRIPTION OF THE DRAWING

The appended claims set forth those novel features which characterize the invention. However, the invention itself, as well as further objects and advantages thereof, will best be understood by reference to the following detailed description of a preferred embodiment taken in conjunction with the accompanying drawing which is a combined schematic and block diagram of a power transition write protection system for a programmable read only memory in accordance with the principles of the present invention.

DESCRIPTION OF THE PREFERRED EMBODIMENT

Referring to the FIGURE, there is shown in combined schematic and block diagram form a write protect system 10 in accordance with the present invention.

The write protect system 10 is intended to operate with a conventional microprocessor 20 which is coupled to a conventional nonvolatile programmable read only memory (PROM) 22 by means of a plurality of control lines. In one embodiment, the PROM 22 is an electrically erasable programmable read only memory (EEPROM). Data is read from and written into the PROM 22 by means of various control signals provided thereto by the microprocessor 20. For example, the PROM 22 is selected when the CHIP-ENABLE ($\overline{CE}$) input from the microprocessor 20 to the PROM 22 is LOW. Data is read from the PROM 22 by the microprocessor 20 with the WRITE ENABLE ($\overline{WE}$) pin of the PROM 22 HIGH and its OUTPUT-ENABLE ($\overline{OE}$) pin LOW. A LOW output provided by the microprocessor 20 to the $\overline{WE}$ input of the PROM 22 with the $\overline{OE}$ input thereto HIGH initiates a cycle that writes data from the microprocessor into the PROM by means of a plurality of INPUT/OUTPUT (I/O) pins (not shown) into a location selected by the address pins. Thus, a write cycle is executed with the $\overline{OE}$ line HIGH and the $\overline{WE}$ line LOW, while a read cycle is executed with the $\overline{OE}$ line LOW and the $\overline{WE}$ line HIGH.

The write protect system 10 includes a reference voltage generator 12, an override trip generator 14, an override control circuit 16, and control logic 18. The microprocessor 20 and the PROM 22 as well as the aforementioned components of the write protect system 10 are coupled to and energized by a DC power supply 37 which outputs a supply voltage $V_{cc}$. The microprocessor 20 and the PROM 22 are designed to operate at a minimum supply voltage of 4.75 VDC, thus in a preferred embodiment $V_{cc} \geq 4.75$ VDC.

$V_{cc}$ is provided to the reference voltage generator 12 which includes a resistor 24 and a grounded Zener diode 26. Resistor 24 and Zener diode 26 are selected such that with a current of between 15 microamps and 20 milliamps, a reference voltage ($V_{REF}$) of between 1.205 and 1.26 VDC is provided to the negative input of a comparator circuit 34. In accordance with the selected operating characteristics of resistor 24 and Zener diode 26, this voltage range corresponds to a supply voltage $V_{cc}$ range of 2 to 5.25 VDC. The lower end of this range, i.e., 2 VDC, is selected so as to overlap the low operating voltage coverage provided by the internal protection circuitry 23 within the PROM 22 which automatically disables it if $V_{cc}$ is below 3 VDC. The upper end of this voltage range, i.e., 5.25 VDC, is established on the basis that this typically is the maximum voltage at which the TTL circuitry within the present invention is capable of operating.

With a reference voltage of between 1.205 and 1.26 VDC provided to the negative input of the comparator 34, a divided down $V_{cc}$ is provided via resistors 28 and 30 to the positive input terminal of the comparator 34. Resistors 28 and 30 form a voltage dividing network which reduces the 4.75 VDC output of the power supply 37 to approximately 1.26 VDC. Thus, under normal operating conditions the input to the positive terminal of the comparator 34 is greater than the input to its negative terminal causing its output to be HIGH in allowing the control logic 18 to take control which permits read and write commands to be provided to the PROM 22 from the microprocessor 20. However, if $V_{cc}$ goes below 4.75 VDC causing the input to the positive terminal of the comparator 34 to go below 1.26 VDC, the comparator circuit 34 will hold its output LOW. As described earlier, $V_{REF}$ will remain at 1.26 VDC so long as $V_{cc}$ is between 2 and 5.25 VDC. A capacitor 36 is coupled across the comparator circuit 34 and serves as a by-pass capacitor to filter out power supply noise from the $V_{cc}$ supply voltage provided to the comparator 34. The combination of comparator circuit 34 and by-pass capacitor 36 forms a microprocessor control signal override circuit 16 as described below.

The aforementioned combination of voltage dividing resistors 28 and 30 in combination with a feedback resistor 32 forms an override trip generator circuit 14. As described above, this circuit divides $V_{cc}$ down to a trip voltage $V_{TRIP}$ for providing a microprocessor control signal override from the comparator 34 to the control line 42 in the event the $V_{cc}$ output from the power supply 37 drops below 4.75 VDC. As described in further detail below, the override signal prevents data from being written into the PROM 22. Resistor 32 within the override trip generator circuit 14 is coupled between the output of the comparator 34 and its positive input pin. Resistor 32 thus feeds some of the output voltage back to the positive input pin of the comparator 34 to provide hysteresis in the circuit in preventing oscillations arising from switching within the comparator 35 due to changes in the value of $V_{TRIP}$ provided to the positive input thereof. Resistor 32 is, in effect, in parallel with resistor 28 when the output of the comparator 34 is HIGH and is in parallel with grounded resistor 30 when the output of the comparator is LOW. By thus adjusting the resistance coupled to the positive input pin of the comparator 34, the switching rate therein is increased. This increased switching rate prevents oscillations within the comparator circuit 34.

As described above, a HIGH $\overline{WE}$ input and a LOW $\overline{CE}$ input to the PROM 22 from the microprocessor 20 in combination with a HIGH R/W output from the microprocessor initiates a read cycle wherein data is read from the PROM 22 by the microprocessor 20. In this mode of operation, the HIGH R/W output from the microprocessor 20 is inverted by means of an open collector inverter 40 which, in turn, provides an active LOW $\overline{OE}$ input to the PROM 22 for executing the read cycle. A write cycle, wherein the microprocessor 20 writes data into the PROM 22, is initiated by LOW $\overline{WE}$ and $\overline{CE}$ inputs from the microprocessor 20 to the PROM 22 in combination with a LOW R/W output from the microprocessor. In this mode of operation, the open collector inverter 40 inverts the LOW R/W output from the microprocessor 20 and provides a HIGH $\overline{OE}$ input to the PROM 22. The description thus far provided is directed to read and write operations between the microprocessor 20 and the PROM 22 under normal operating conditions.

The write protect system 10 of the present invention comes into play during power up, power down, and transient power conditions within the microprocessor controlled system. In the event $V_{cc}$ is less than 4.75 VDC, the $V_{TRIP}$ input to the comparator 34 causes the output of the comparator provided to control logic 18 which includes the control line 42 which thereupon goes LOW. The control logic further includes a resistor 38 coupled to the power supply 37 as well as an open collector inverter 40 coupled between the microprocessor 20 and the PROM 22. The control line 42 is coupled between the output of the open collector inverter 40 and the $\overline{OE}$ input pin of the PROM 22. A LOW output from the comparator 34 to the control line 42 disables the open collector inverter 40 and pulls the $\overline{OE}$ input pin of the PROM 22 LOW. This represents the read mode of operation in the PROM 22 and prevents the writing of erroneous data by the microprocessor 20 into the PROM 22 when the supply voltage is less than a predetermined voltage level. With the supply voltage $V_{cc}$ at or above its minimum operating level, i.e., 4.75 VDC, the comparator 34 provides a HIGH output to the control line 42 allowing the open collector inverter 40 to function normally. In this case, resistor 38 permits whatever is provided to the input of the open collector inverter 40 to be output therefrom in an inverted condition. Thus, a HIGH R/W output from the microprocessor 20 will be inverted by the open collector inverter 40 which, in turn, provides a low $\overline{OE}$ input to the PROM 20 for initiating a read cycle. Similarly, a low R/W output from the microprocessor 20 will be inverted by the open collector inverter 40 so as to provide a high $\overline{OE}$ input to the PROM 22 in initiating a write cycle. The open collector inverter 40 thus performs as an active device with the control line 42 LOW and the supply voltage $V_{cc}$ below a predetermined level when it is disabled, and performs as a passive device with the control line 42 HIGH at normal operating voltages.

There has thus been shown a power transition detection and override circuit for use in a microprocessor controlled system including a nonvolatile programmable read only memory device which prevents inadvertent write commands from the microprocessor to the memory device caused by supply voltage variations. If the supply voltage drops below a predetermined level, the power transition detection and override circuit holds the memory device's read/write line in a read state until the supply voltage is once again at its normal operating level. This masks any WRITE ENABLE line glitches by the read operation of the active low OUTPUT-ENABLE line of the programmable read only memory device.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. For use with a nonvolatile electrically erasable programmable read only memory (EEPROM) and a microprocessor coupled by means of a bi-stable OUTPUT-ENABLE control line wherein the microprocessor provides an enable signal via said OUTPUT-ENABLE control line to the EEPROM for reading data from the EEPROM with the OUTPUT-ENABLE control line in a first state and writing data into the EEPROM with the OUTPUT-ENABLE control line in a second state, said EEPROM and said microprocessor further coupled to a power supply and energized by a predetermined voltage level therefrom, a circuit for preventing the inadvertent writing of data by the microprocessor into the EEPROM when the supply voltage drops below said predetermined voltage level, said circuit comprising:

supply voltage detection means including means for generating said predetermined voltage level and voltage comparison means coupled thereto and to the power supply and responsive to the supply voltage therefrom for comparing the supply voltage with said predetermined voltage level and for generating a control signal when the supply voltage drops below the predetermined voltage level; and control means coupled to the OUTPUT-ENABLE control line and to said supply voltage detection means and responsive to said control signal output therefrom for overriding the enable signal from the microprocessor and maintaining the OUTPUT-ENABLE control line in said first state when the supply voltage is less than the predetermined voltage level in preventing the inadvertent writing of data by the microprocessor into the EEPROM with variations in the supply voltage of the power supply.

2. The circuit of claim 1 wherein said predetermined voltage level is approximately 4.75 VDC.

3. The circuit of claim 1 wherein the first state is LOW and the second state is HIGH.

4. The circuit of claim 1 wherein said control means includes open collector inverter means in the control line for controlling the state thereof in accordance with said control signal and resistor means coupled to the control line and to the power supply for rendering said open collector inverter means inoperative when said control signal from said control means maintains the control line in said second state.

5. The circuit of claim 1 wherein the memory includes self-protect means for preventing the writing of data therein from the microprocessor if said supply voltage is less than a designated voltage value, wherein said designated voltage value is less than the predetermined voltage level.

6. The circuit of claim 1 wherein said supply voltage detection means includes means for generating said predetermined voltage level and voltage comparison means coupled thereto and to the power supply for comparing the supply voltage with said predetermined voltage level and for generating said control signal when the supply voltage drops below the predetermined voltage level.

7. The circuit of claim 6 further comprising feedback means coupled between the control line and said voltage comparison means for preventing the oscillation thereof.

* * * * *